(12) United States Patent
Ryan

(10) Patent No.: US 7,091,742 B2
(45) Date of Patent: Aug. 15, 2006

(54) FAST RING-OUT DIGITAL STORAGE CIRCUIT

(75) Inventor: Thomas E. Ryan, Batavia, IL (US)

(73) Assignee: Tellabs Operations, Inc., Naperville, IL (US)

( * ) Notice: Subject to any disclaimer, the term of this patent is extended or adjusted under 35 U.S.C. 154(b) by 56 days.

(21) Appl. No.: 10/326,791

(22) Filed: Dec. 19, 2002

(65) Prior Publication Data
US 2004/0119505 A1 Jun. 24, 2004

(51) Int. Cl.
H03K 17/16 (2006.01)
(52) U.S. Cl. ............................. 326/27; 326/94; 326/82
(58) Field of Classification Search ............ 326/26–28, 326/82–98
See application file for complete search history.

(56) References Cited

U.S. PATENT DOCUMENTS

| | | | |
|---|---|---|---|
| 4,544,851 A | | 10/1985 | Conrad et al. |
| 4,745,302 A | | 5/1988 | Hanawa et al. |
| 4,851,710 A | | 7/1989 | Grivna |
| 5,122,694 A | | 6/1992 | Bradford et al. |
| 5,264,738 A | * | 11/1993 | Veendrick et al. ........... 327/203 |
| 5,376,848 A | * | 12/1994 | Hanke et al. ................ 327/141 |
| 5,418,407 A | | 5/1995 | Frenkil |
| 5,719,878 A | * | 2/1998 | Yu et al. ...................... 714/726 |
| 5,982,211 A | * | 11/1999 | Ko ................................ 327/202 |
| 6,198,324 B1 | * | 3/2001 | Schober ....................... 327/202 |

OTHER PUBLICATIONS

*Correspondence, Anomalous Behavior of Synchronizer and Arbiter Circuits*; Thomas J. Chaney and Charles E. Molnar, IEEE Transactions on Computers, Apr. 1973, 2 pages.
*Anomalous Response Times of Input Synchronizers*, Miroslav Pechoucek, IEEE Transactions on Computers, vol. 25, No. 2, Feb. 1976; 7 pages.
*The Behavior of Flip-Flops Used as Synchronizers and Prediction of Their Failure Rate*; Harry J.M. Veendrick, IEEE Journal of Solid-State Circuits, vol. SC-15, No. 2, Apr. 1980, pp. 169-176.
*Prediction of Error Probabilities for Integrated Digital Synchronizers*, Jakob H. Hohl, Wendel R. Larsen and Larry C. Schooley, IEEE Journal of Solid-State Circuits, vol. SC-19, No. 2, Apr. 1984, pp. 236-244.
*Metastable Behavior in Digital Systems*, Linday Kleeman and Antonio Cantoni, University of Newcastle, New South Wales, IEEE Design & Test of Computers, Dec. 1987, pp. 4-19.
*How to Avoid Synchronization Problems*, Peter A. Stoll, VLSI DESIGN, Nov./Dec. 1982, pp. 56,47 and 59.
*Designer's Guide to: Minimizing the Effect of Metastablity in BiCMOS Circuit Design*; K. Nootbaar, R. W. Spehn and E. Tyler, AMCC® Applied Micro Circuits Corporation, 1990, 8 pages, no month.
*Design a digital synchronizer with a low metastable-failure rate*, Steven R. Masteller, EDN, Apr. 25, 1991, pp. 169-172, 174.

(Continued)

Primary Examiner—Don Le
(74) Attorney, Agent, or Firm—Welsh & Katz, Ltd.

(57) ABSTRACT

A static storage element distorts metastable feedback signals in an unbalanced feedback loop with the resulting metastable signals eroding and being suppressed as they circulate in the loop. The element exhibits a predetermined output state subsequent to suppression of the eroded signals.

19 Claims, 7 Drawing Sheets

OTHER PUBLICATIONS

*Comments on 'Random Serial Bit Code Generator'*, This article was first published in Electronic Product Design, vol. 15, Issue 6; Jun. 1994, 3 pages.

*Metastable Recovery*, ZAPP 094 Nov. 24, 1997 (Version 2.1), pp. 13-47 through 13-49.

*Metastability in Altera Devices,* Altera Corporation, May 1999, ver. 4, Application Note 42, pp. 1-11.

*Metastabilty and the ECLinPS™ Family,* Rennie Wm. Dover and Todd Pearson, Semiconductor Components Industries, LLC, 2000, Oct. 2000-Rev. 1, pp. 1-8.

*METASTABILITY A Study of the Anomalous Behavior of Synchronizer Circuits*, Danesh M. Tavana, 8 pages—published before filing date of Dec. 19, 2002.

*Metastability,* ADD Automation, pp. 1-7—published before filing date of Dec. 19, 2002.

*Principles of CMOS VLSI Design A systems Perspective*, Neil Weste and Kamran Eshraghian, 6 pages—published before filing date of Dec. 19, 2002.

\* cited by examiner

FAST RING-OUT DIGITAL STORAGE CIRCUIT

FIELD OF THE INVENTION

The invention pertains to multi-state circuits. More particularly, the invention pertains to such circuits which minimize the duration of metastable states.

BACKGROUND OF THE INVENTION

Known multi-state storage circuits often incorporate one or more active elements combined with feedback circuitry to produce a plurality of output states. Reliable achievement of an expected output state in response to a set of inputs can be critical to downstream circuit performance.

Figure 1:
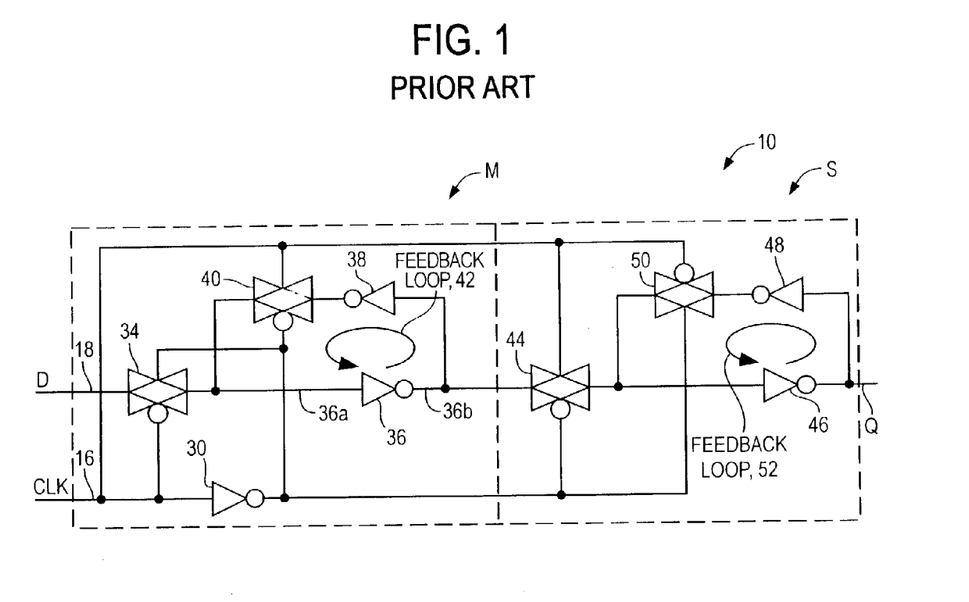
FIG. 1 is a schematic diagram of a prior art D-type flip-flop.

FIG. 1 illustrates a known realization of an exemplary multi-state storage circuit 10, a D-type flip-flop. The realization of FIG. 1 is a master, M, slave, S, configuration implemented using inverters with a clock input, line 16 and a data input, line 18.

In FIG. 1, inverter 30 provides an inverted clock signal. Circuit elements 34–40 constitute the "master", M, latch. Circuit elements 44–50 make up the "slave", S, portion. Together, the master and slave create a positive edge triggered behavior, with respect to clock signals CLK on line 16.

Elements 34 and 40 are known non-inverting transmission or pass gates which resemble switches that are either open circuited or conducting. They are connected in an opposite manner to the CLK or inverted CLK signal such that one element is open and the other is conducting at any given time. This prevents contention at the input of inverter 36.

Elements 36 and 38 are inverters which provide a stable feedback loop 42 when CLK is "high" (logic 1 state). In this case, element 34 is open and 40 is conducting.

When CLK is "low" (logic 0 state), the master stage M is sampling the D input. Element 34 is conducting. Element 40 is open circuited. The slave section S, behaves identically but CLK is driven by an inverted clock signal from inverter 30.

During a critical time when the CLK signal, on line 16, rises, the master M transitions from a transparent to latching state while the slave S goes from the latching to transparent state. For reliable operation, the CLK signal must not rise before the logic state of the D input, line 18, has had enough time to pass through elements 34, 36, and 38. This ensures an orderly transition to the latching state since the output of element 40 will drive the input of inverter 36 with the same logic state that element 34 had been conducting.

A metastable condition can occur when the CLK signal rises before the latest D input state change on line 18 has had time to traverse the feedback loop to the output of inverter 38. In this case, multiple logic states can co-exist in the feedback loop 42 when the master section M enters the latching state. In this instance, the feedback loop 42 forms an oscillator that can ring for an unpredictable amount of time, a metastable state, and resolve to an unpredictable final state.

The length of time that the oscillation will persist is related to the duty cycle distortion experienced by the signal as it completes one circuit through the feedback loop 42. The lower the duty cycle distortion, the longer the oscillation will remain.

For optimal flip-flop performance, designers have used symmetrically balanced inverters and pass gates. In such designs, key flip-flop parameters such as set-up and hold times are equal for both logic 1 and 0 data conditions. Balanced inverters and pass gates also result in low duty cycle distortion in the feedback path. Hence, known flip-flop designs can have very low duty cycle distortion and inadvertently provide feedback paths that can remain in the metastable state for relatively long periods of time relative to the period of the CLK signal. The existence of metastable states in digital circuits is inconsistent with reliable operation of such circuits.

There is thus a continuing need for multi-state circuits which promptly suppress metastable states for a given maximum sampling rate. Preferably such circuits could be fabricated using known techniques so as to avoid having to develop new manufacturing methodologies. Additionally, it would be preferred if such circuits could be implemented with minimal additional components.

SUMMARY OF THE INVENTION

In one embodiment of the invention a circuit has an input and a storage element coupled at least to the input. The storage element has an unbalanced feedback loop that produces a predetermined degree of duty cycle distortion of electrical signals circulating in the feedback loop.

Numerous other advantages and features of the present invention will become readily apparent from the following detailed description of the invention and the embodiments thereof, from the claims and from the accompanying drawings.

DETAILED DESCRIPTION OF THE PREFERRED EMBODIMENTS

While embodiments of this invention can take many different forms, specific embodiments thereof are shown in the drawings and will be described herein in detail with the understanding that the present disclosure is to be considered as an exemplification of the principles of the invention and is not intended to limit the invention to the specific embodiments illustrated.

Figure 2:
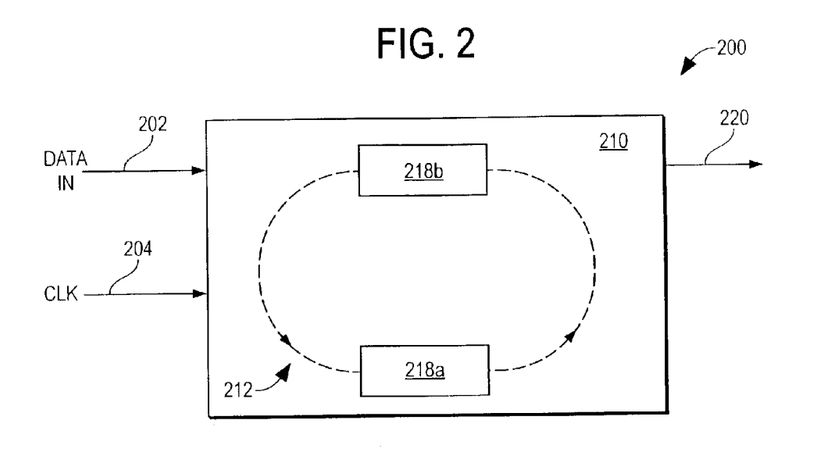
FIG. 2 is a block diagram of a storage circuit in accordance with the present invention.

FIG. 2 illustrates a static, multi-state circuit 200 which embodies the present invention. The circuit 200 includes a data input line 202 which could carry asynchronous digital signals and a clock input line 204. The clock signals on the line 204 could be used to drive other circuitry.

The circuit of FIG. 2 purposely degrades trapped feedback pulses which in turn will terminate any metastable state exhibited within a quantifiable maximum ring-out time. This in turn facilitates defining a minimum sampling clock wherein the storage circuitry could be operated with substantially error-free performance.

In one embodiment of the invention, distortion in the feedback path can be produced by changing parameter ratios of transistors in the feedback path to provide unbalanced circuit performance. Where two inverters are used in the feedback path, they can be ratioed in the opposite way, for example by changing switching thresholds, (increasing in one inverter, decreasing in the other) such that the trapped feedback pulse is repeatedly narrowed, and ultimately suppressed, as it passes through each inverter.

The circuit 200 incorporates a static, multi-state storage circuit generally indicated at 210 which incorporates a feedback loop 212. It will be understood by those of skill in the art that the storage circuit 210 could be implemented with a variety of circuit configurations such as flip-flops or latches implemented as MOS-type storage elements, CMOS-type storage circuits, ECL-type storage circuits, TTL-type storage circuits or capacitively coupled storage circuits and the like without departing from the spirit and scope of the present invention. Neither the specific circuit designs nor manufacturing technologies are limitations of the invention.

The feedback loop 212 incorporates at least first and second circuit elements 218a and 218b. The circuit elements 218a, b could incorporate inverters, as well as non-inverting switches, of a type known to those of skill in the art. Output line 220 reflects the state of circuit 200.

The elements 218a, b are unbalanced, as described in more detail subsequently. This unbalancing distorts signals in the feedback path 212 to absorb metastable events, which may occur, within just a few oscillations or periods. Since the frequency of oscillation in a metastable state is equal to the transit time of pulses through the feedback loop 212, maximum oscillation ring-out time can be determined and reduced by adjusting the distortion of the duty cycle. Suppression of the metastable events in accordance with the present invention produces improved performance without introducing additional circuit elements.

The unbalanced, asymmetrical, storage circuits of the present invention can also be incorporated as the slave section, S, of master-slave storage devices to minimize the duration for metastable states. Unlike prior art solutions, storage circuits which embody the present invention suppress metastable events within a predictable number of cycles making it possible to design highly reliable synchronizing circuits with error probabilities approaching zero.

Achieving an unbalanced feedback loop in a storage circuit or device such as storage device 210 can be accomplished by adjusting relative parameter values of those transistors or resistors in the respective feedback loop 212 which are responsible for propagating either rising or falling edges of electrical pulses circulating in the feedback loop 212. As explained subsequently, the loop can be unbalanced to drive the output value to a predetermined high or low state within a known time interval.

Figure 3A:
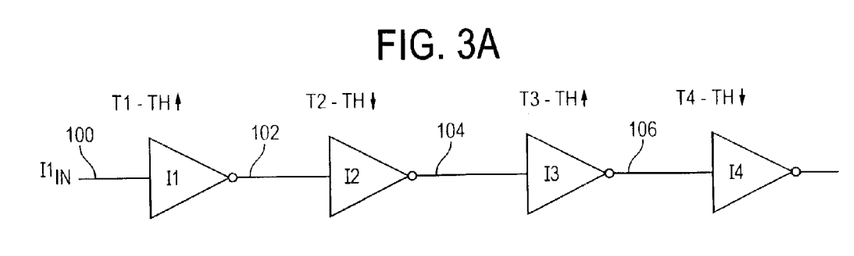
FIG. 3A illustrates a circuit with unbalanced inverters.
Figure 3B:
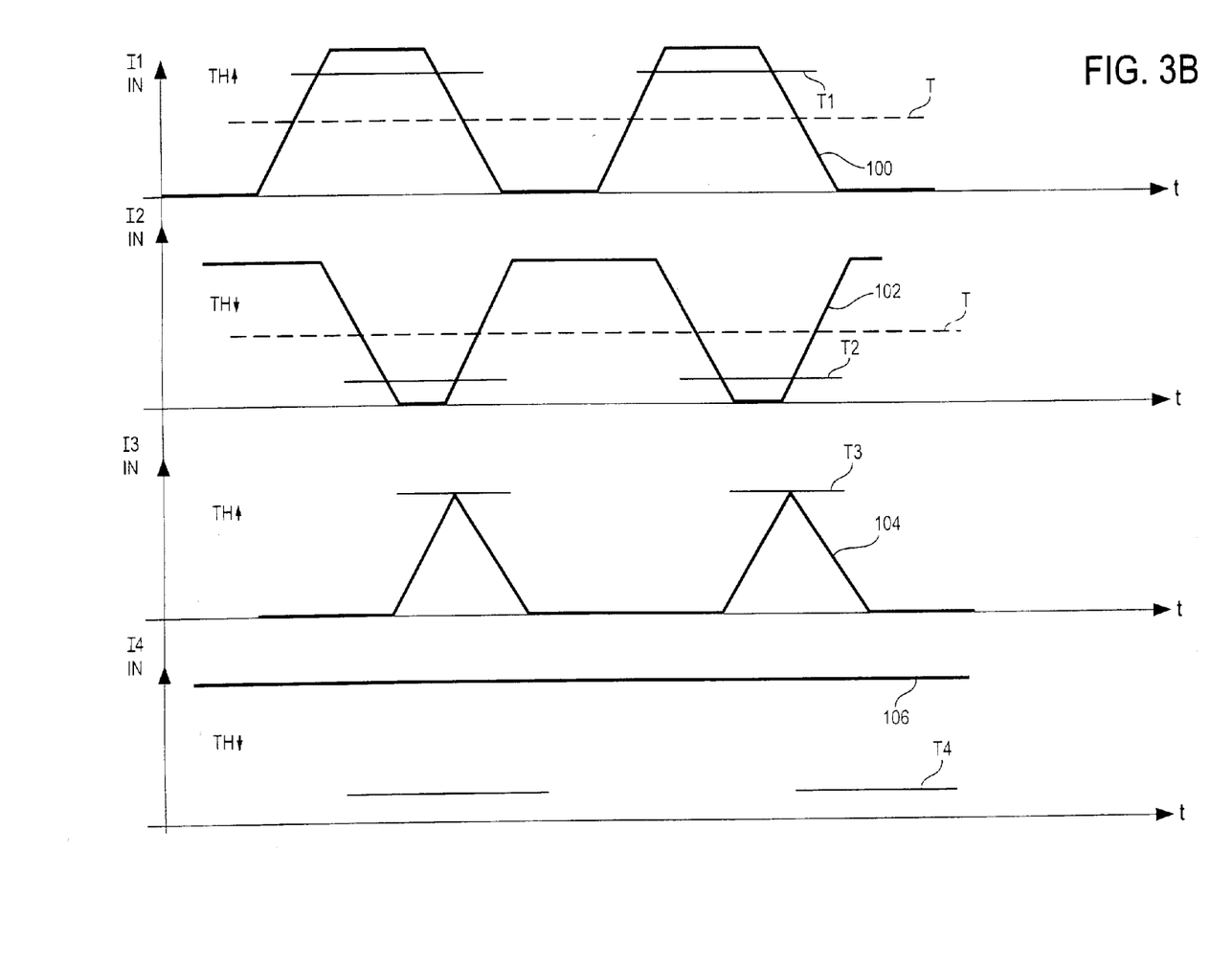
FIG. 3B is a plurality of waveforms illustrating performance of the circuit of FIG. 3A.

FIGS. 3A and 3B together illustrate the effects of unbalancing exemplary inverters. It will be understood that the inverters could be implemented in a variety of technologies, and with varying circuit details, without departing from the spirit and scope of the present invention.

FIG. 3A illustrates a string of series connected inverters I-1, I-2, I-3 and I-4. Each of the inverters has been unbalanced such that its switching threshold has been shifted either up or down from a normal balanced state. The balanced threshold T would be midway between the electrical signals corresponding to a logical one and a logical zero, for example, five volts and zero volts. Alternate inverters I-1, I-3 have been unbalanced so as to shift their respective thresholds T-1, T-3 in the opposite direction from that of the intervening inverters I-2, I-4, T-2, T-4.

FIG. 3B is an exemplary timing diagram illustrating the consequences of unbalancing inverters I-1. . . I-4 as in FIG. 3A. As illustrated in FIG. 3B, a pulse train 100 is coupled as an input to inverter I-1.

A second waveform 102 is the output from inverter I-1 in response to the input thereto, waveform 100. As illustrated in FIG. 3B, waveform 102 has become distorted and asymmetrical with the higher level increasing in duration due to the unbalanced increased switching threshold T-1 of inverter I-1. Waveform 104 illustrates the output of inverter I-2, which has a reduced threshold T-2, the input to inverter I-3. Waveform 104 exhibits distorted, expanded low voltage compared to the input 100 to inverter I-1.

Waveform 106, the output of inverter I-3, has been distorted to the extent that the amplitude variations of waveform 100, input to inverter I-1, have been completely suppressed or eroded. Thus, unbalancing circuits, such as inverters, as illustrated in FIGS. 3A, B, can produce distorted waveforms and result in suppression of pulses in the downstream portions of the circuitry. In general in a digital system the distortion exhibited by waveform 106 is undesirable and is to be avoided as the information carried by signal 100 has been lost.

Figure 4:
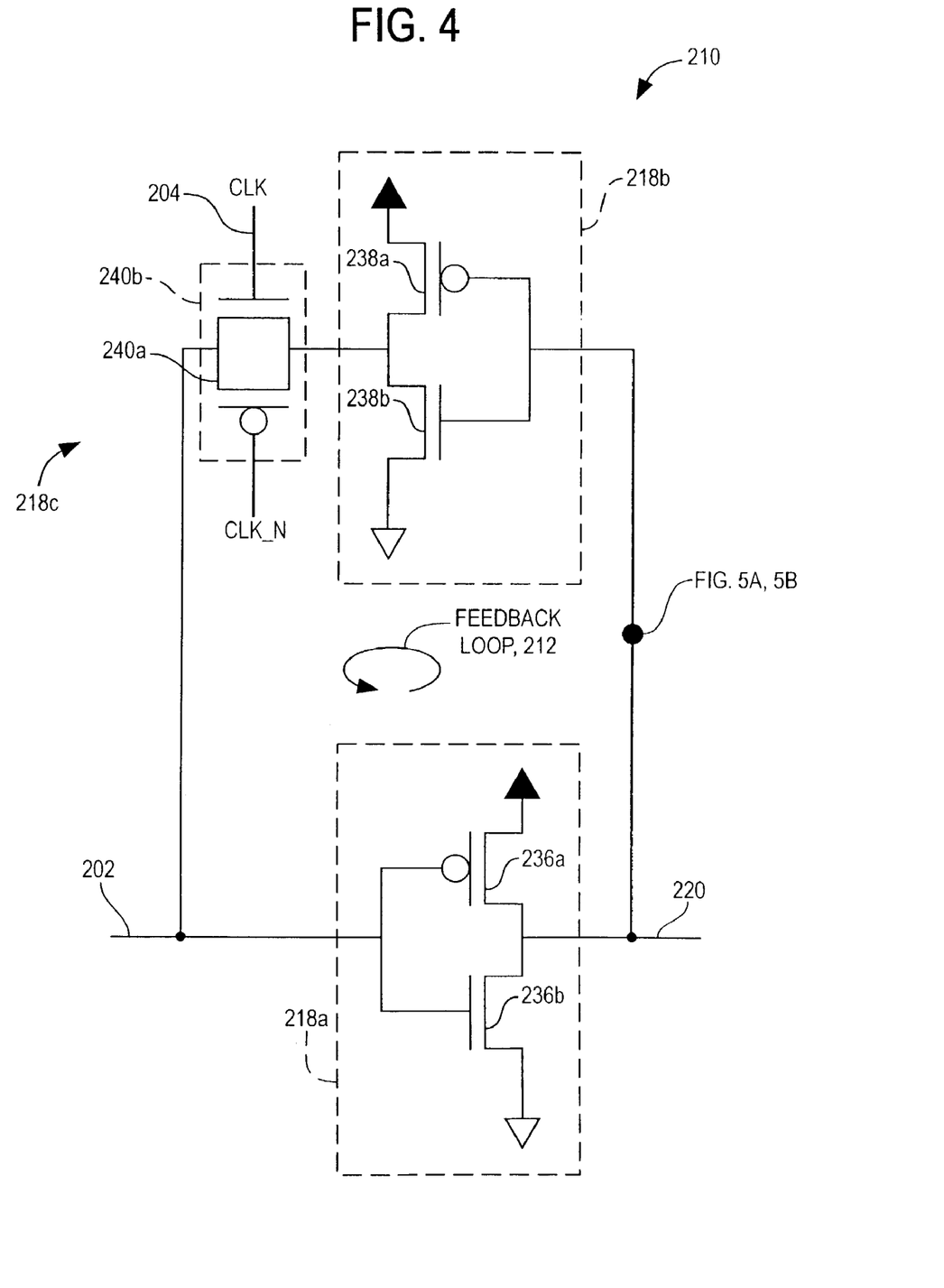
FIG. 4 is a schematic diagram illustrating details of an embodiment of the storage circuitry of the FIG. 2.

FIG. 4 illustrates details of an exemplary two state, static implementation of storage element 210. For best mode purposes, circuit 210 has been illustrated as implemented with CMOS circuit elements. It will be understood that other types of CMOS or MOS circuit elements, bipolar circuit elements and/or alternate latch or flip-flop circuit designs all, without limitation, come within the spirit and scope of the invention.

Element 218a, a complementary CMOS inverter of a known type, incorporates MOS transistors 236a, b. Element 218b, a complementary CMOS inverter of a known type, incorporates MOS transistors 328a, b. Loop 212 includes CMOS transmission gate 218c.

The inverters 218a, b and switch 218c could be realized using standard CMOS transistor fabrication techniques. Inverter 218a incorporates a P-type CMOS transistor 236a and an N-type CMOS transistor 236b. Transistors 236a, b are coupled in series with a common output on line 220 as is conventional.

Outputs from inverter 218a, line 220 are coupled as inputs to inverter 218b. Inverter 218b incorporates a P-type CMOS transistor 238a which is series coupled to an N-type CMOS transistor 238b also as is conventional. A common output from inverter 218b is in turn coupled to non-inverting transmission gate 218c which incorporates a P-type CMOS transistor 240a and an N-type CMOS transistor 240b. Output from the gate 218c is coupled back as an input to inverter 218a via line 202.

Figure 5A:
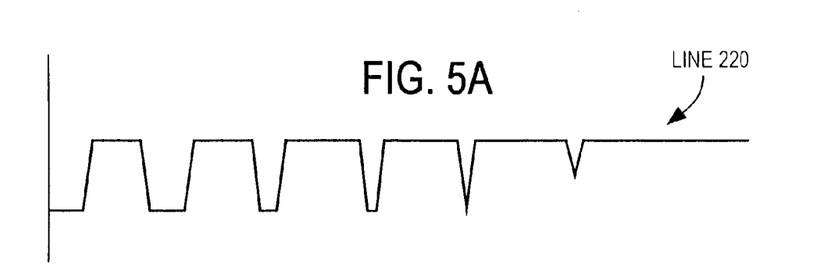
FIGS. 5A and 5B are wave forms illustrating various operational characteristics of the storage circuitry of FIG. 4.
Figure 5B:
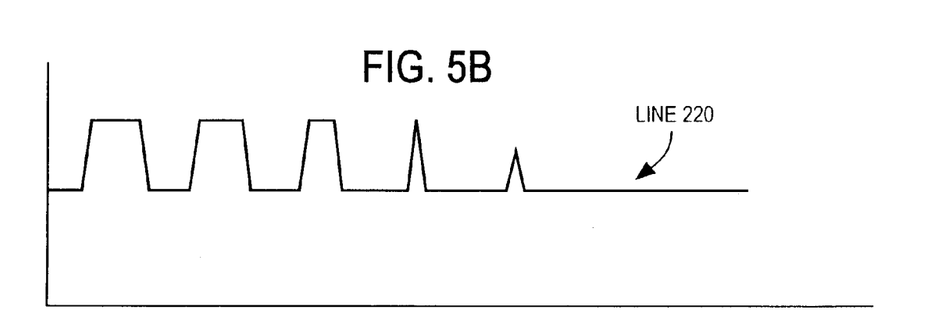

The transistor pairs 236a, b, 238a, b and 240a, b are unbalanced by adjusting respective parameter values, such as their respective gains, to increase or decrease their respective switching thresholds going around the loop 212 so as to erode or suppress metastable pulses as illustrated in FIG. 5B. For example and without limitation, the gate geometries of the respective pairs, the thickness of the respective gate oxide layers of the respective pairs, the dopant density of the respective pairs can be adjusted to force the respective switching threshold from a balanced value to an unbalanced value as illustrated in FIG. 3A. Other parameters could also be unbalanced and such unbalancing falls within the spirit and scope of the invention.

By providing P-type transistors 236a, 238a and 248a with greater gain values than N-type transistors 236b, 238b and 240b distortion as in FIG. 5A can be produced. This distortion erodes or degrades metastate oscillations as they circulate in loop 212 causing them to cease relatively quickly and resulting in a stable high or logical one output state on the line 36b'. Alternately, unbalancing the respective pairs 236a, b; 238a, b; and 240a, b; in the opposite manner will produce a feedback loop 212 which erodes or terminates metastable oscillations to a logical zero or low output state on the line 220 as in FIG. 5B. Elements 218b and 218c could be replaced with a single tristate inverter to reduce component count without departing from the spirit and scope of the invention.

The circuitry of FIG. 4 could be used to implement the master section M of a master/slave flip-flop if desired. This implementation would address the source of any metastable behavior. Additionally, the circuitry of FIG. 4 could also be used to implement the slave portion S of a D-type or master/slave flip-flop as in FIG. 1. In the slave feedback loop, the time between active and inactive clock edges would normally be expected to be longer than the maximum ring-out time of the feedback loop 212.

It will be understood that a variety of multi-state circuits such as T-type or R-S flip-flops could be implemented using unbalanced configurations without departing from the spirit and scope of the invention. Other multi-state circuits which include feedback could also be implemented with unbalanced feedback loops.

Figure 6:
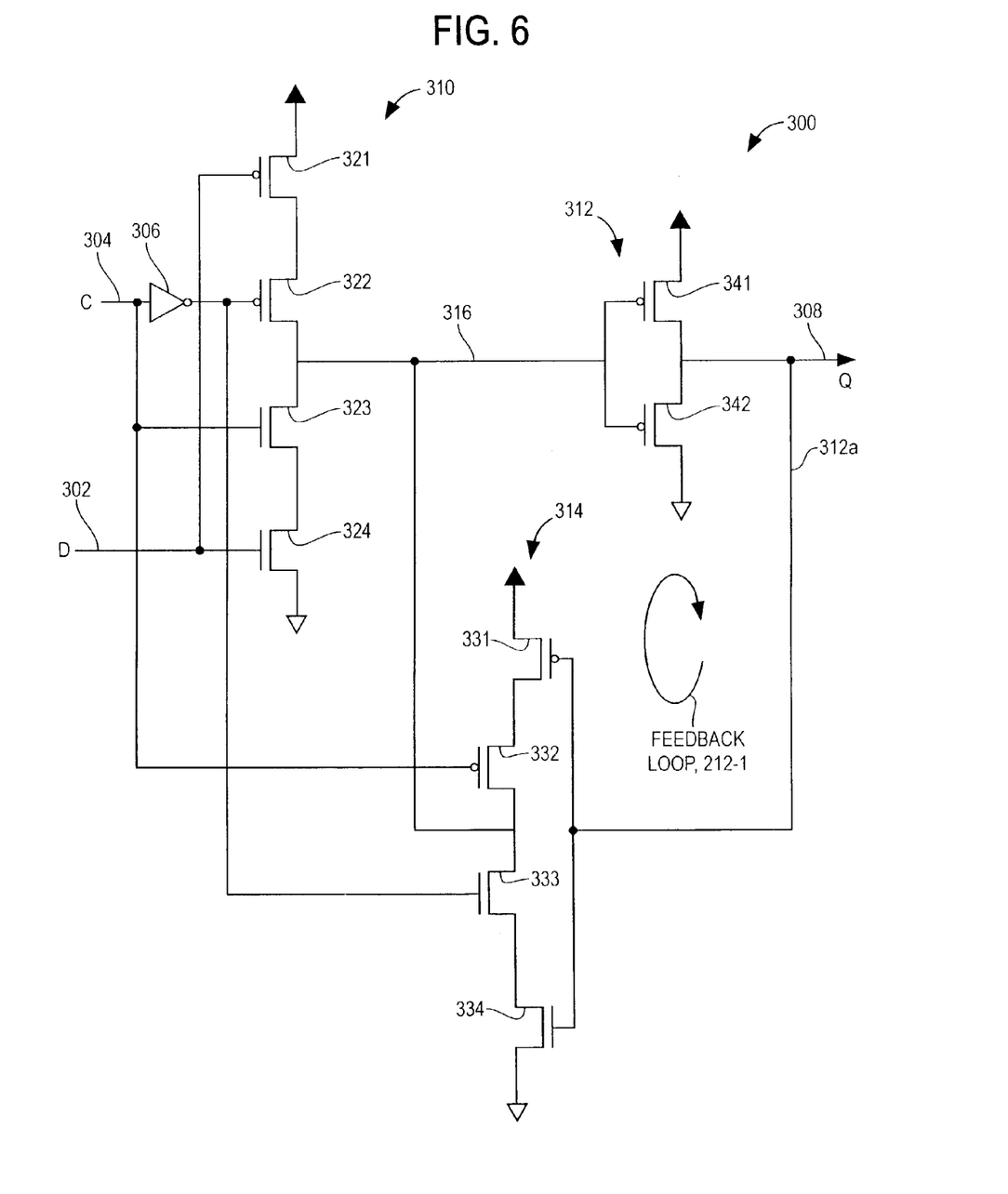
FIG. 6 is a schematic diagram illustrating another embodiment of a D-type storage circuit.

FIG. 6 illustrates a D-type MOS latch 300 which has an alternate architecture and which embodies the present invention. The latch 300 has a D-input 302 and a clock input 304. An inverter 306 provides an inverted clock signal. An output, Q, that tracks the D-input is provided on line 308.

The latch 300 incorporates a first inverter 310 which receives inputs from both the D-input 302 and the clock signal 304. Output from the inverter 310 is coupled via line 316 as an input to inverter 312 and an output of inverter 314. An output 312a of inverter 312 is coupled to an input to inverter 314.

The inverter 310 incorporates transistors 321, 322, each of which is a P-channel MOSFET. It also incorporates N-channel MOSFETs 323, 324.

The inverter 312 incorporates a P-channel MOSFET 341 and an N-channel MOSFET 342. The inverter 314 incorporates P-channel MOSFETs 331 and 332 and N-channel MOSFETs 333 and 334. As illustrated, input line 312a is coupled to transistors 331 and 334 in inverter 314.

When the clock signal on line 304 goes high, transistors 322 and 323 turn on. The signal on the D-input line 302 is inverted and coupled by a line 316 to inverter 312. During this time interval, inverter 314 is turned off. The inverter 312 inverts the signal on the line 316 and couples it to output line 308 as the Q output for the device.

When clock on line 304 goes low, gate 310 turns off and does not output a signal. At that time, gate 314 is enables and couples an inverted representation of the signal on line 312a to line 316. This provides a stable output of the value of the D-input on the line 308.

In accordance with the invention, to suppress metastable states, the feedback path 212-1 involving inverters 312 and 314 can be unbalanced by increasing the switching threshold of inverter 312 and decreasing that of inverter 314 as discussed above, or alternately, decreasing the switching threshold of inverter 312 and increasing the switching threshold of inverter 314. Using the process as described above, metastable states can be suppressed or eroded.

Figure 7:
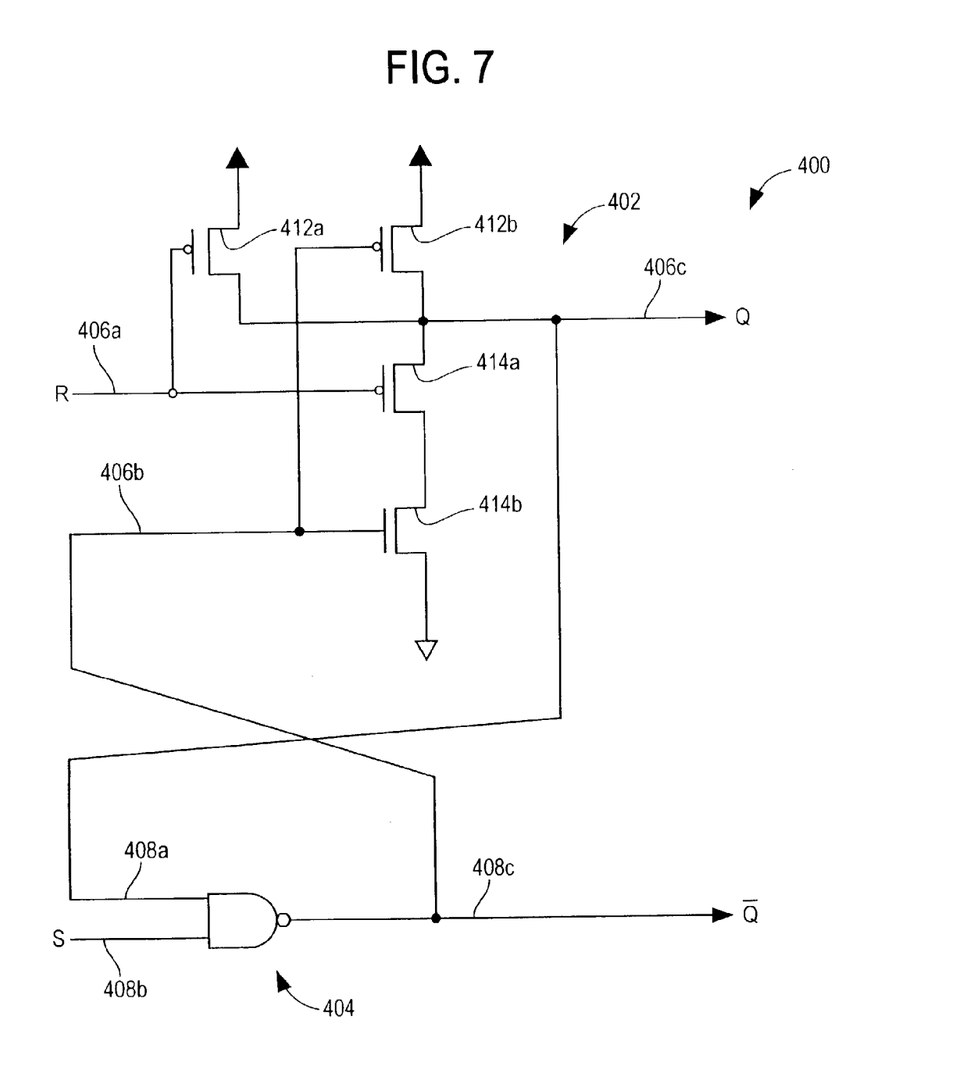
FIG. 7 is a schematic diagram of an R-S-type storage circuit in accordance with the present invention.

FIG. 7 illustrates an R-S-type storage circuit 400 having yet another circuit topology and which embodies the present invention. The circuit 400 includes two cross connected, two input, NAND gates 402 and 404 which are substantially identical structurally, but, in accordance with the invention, are adjusted so as to exhibit an unbalanced feedback loop for the purpose of suppressing metastable states.

The NAND gate 402 includes first and second inputs 406a, b and an output 406c, the Q output. The NAND gate 404 also has inputs 408a, b and an output 408c which is coupled back to input 406b of gate 402. Similarly, the output of gate 402, line 406c is coupled back to input 408a of gate 404. The cross-connected gates 402, 404 exhibit the expected behavior of an R-S-type storage circuit.

NAND gate 402 incorporates first and second P-channel transistors 412a, b and first and second N-channel transistors 414a, b. As illustrated in FIG. 7, the four transistors 412a, b and 414a, b are interconnected so as to implement the NAND function as would be understood by those of skill in the art. Additionally, transistors 412b and 414b are in a feedback loop being coupled via line 406b to output line 408c of gate 404. Gate 404 has a similar pair of transistors coupled in a feedback loop via line 408a and output 406c.

Circuit 400, in addition to exhibiting first and second states in response to input set and reset signals can also exhibit undesirable metastable states where those signals change substantially and simultaneously, for example from a low level to a high level.

In accordance with the present invention, the feedback loops in circuit 400 can be unbalanced, as discussed above. For example, a switching threshold of one pair of transistors, such as transistors 412b, 414b, gate 402 can be increased or decreased while a switching threshold of the corresponding pair of transistors in gate 404 can be decreased or increased thereby producing the desired unbalanced feedback loop. This will in turn erode and suppress any metastable pulses as discussed previously.

As illustrated by the above exemplary embodiments, a variety of circuit topologies come within the spirit and scope of the present invention. Similarly, alternate ways to provide an unbalanced feedback loop, hence, the desired duty cycle distortion, also come within the spirit and scope of the invention.

As is known, MOS processes produce a range of P-type and N-type transistor performance. The extent of the intentional mismatch should be such that the desired degree of duty cycle distortion is maintained for all fabrication outcomes.

In the worst case output, the duty cycle distortion will be weakest and the ring-out time will be the longest. As would be understood by those of skill in the art, the mismatch factor required to achieve a maximum desired ring-out time is determinable for this circumstance. It sets a lower limit on the period of the clock signal for the desired reliable operation.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

The invention claimed is:

1. A circuit comprising:
   a data input; and
   a storage element coupled at least to the data input, the storage element having first and second unbalanced feedback loops, each of which produces a predetermined degree of duty cycle distortion of electrical signals circulating in the respective feedback loop at least one of the feedback loops including at least a non-inverting gate having an unbalanced switching characteristic to contribute to the duty cycle distortion.

2. A circuit as in claim 1 which includes at least one switching element which comprises a complimentary pair of transistors where the transistors exhibit different respective parameter values which promote absorption of metastable events in the feedback loop.

3. A circuit as in claim 1 where the storage element includes first and second unbalanced inverters coupled together via a respective feedback loop with the gate coupled between the inverters in the respective feedback loop.

4. A circuit as in claim 3 where at least one of the inverters comprises first and second asymmetrical switching elements.

5. A circuit as in claim 4 where the switching elements comprise complementary transistors.

6. A circuit as in claim 1, where the storage element comprises a flip-flop having at least a first set of semiconductor elements and a second set of semiconductor elements that are counterparts to the first set of semiconductor elements, the first set of semiconductor elements being mismatched to the second set of semiconductor elements with the unbalanced gate therebetween.

7. A circuit as in claim 6 where the semiconductor elements include P-type transistors and N-type transistors, and wherein P-type transistors and N-type transistors biased in opposite directions are mismatched to produce an unbalanced switching characteristic.

8. A circuit as in claim 1 where the storage element includes first and second latches coupled in series, and wherein each of the latches has a feedback loop and a respective unbalanced parameter wherein a feedback signal circulating in a respective feedback loop has a predetermined degree of distortion and where the gate is located in a selected one of the feedback loops.

9. A circuit as in claim 8 where the latches each include at least first and second inverting elements, each of the inverting elements having a distortion producing set of parameters with one set of parameters producing a first distortion and with the other set of parameters producing an opposite distortion of the feedback signal.

10. An apparatus as in claim 9 where duty cycle distortion in the feedback loop absorbs metastable events within a predetermined number of oscillations of signals in the feedback path.

11. A metastable state suppressing circuit comprising:
    a first switching element, and a second switching element, the two switching elements coupled to form at least a bi-state configuration with each switching element having a switching parameter value displaced from a common balanced parameter value with one switching element's parameter value greater than the balanced value and the other switching element's parameter value less than the balanced value with the switching parameters comprising switching thresholds with the one switching element's switching threshold exceeding a common balanced threshold value and the other switching element's switching threshold less than the common balanced threshold value.

12. A circuit as in claim 11 where the switching elements are selected from a class which includes CMOS circuits, emitter coupled logic-type circuits, MOS-type circuits, gallium arsenide-type circuits and bi-polar transistor type circuits.

13. A circuit as in claim 11 where the unbalanced switching parameter values terminate a metastable state exhibited by the bi-state configuration.

14. A circuit as in claim 13 where the bi-state configuration exhibits a predetermined output state and another state and with the respective switching parameter values displaced from the balanced parameter value to cause the bi-state configuration to exhibit the predetermined output state when the metastable state terminates.

15. A device comprising:
    first and second inverter circuits, each inverter circuit having an input and an output, each input of each inverter circuit is coupled to the output of the other inverter circuit to form a first bistable unit, each inverter circuit defines a switching threshold, the switching threshold for one inverter is offset from the switching threshold for the other inverter, the switching thresholds each introduce respectively first and second types of duty cycle distortion such that the offset between the thresholds suppresses oscillating signals circulating through the inverters and, an isolation gate is coupled between the inverters and where each inverter receives electrical signals that vary over a predetermined range with the offset between the thresholds less than the range of predetermined signals and where one threshold exceeds a midpoint of the range and the other threshold is less than the midpoint of the range.

16. A device as in claim 15 which includes third and fourth inverter circuits, each of the third and fourth inverter circuitries has an input and an output with each input of the third and fourth inverter coupled to an output of the fourth and third inverters to form a second bistable unit where the first and second bistable units implement a master-slave flip-flop.

17. A device as in claim 15 with the isolation gate having an unbalanced switching characteristic to produce duty cycle distortion that contributes to suppressing oscillating signals circulating through the inverters.

18. A device as in claim 17 where the duty cycle distortion of the gate corresponds to the type of duty cycle distortion of the inverter feeding signals to the gate.

19. A device as in claim 15 where the thresholds vary from the midpoint of the range by a common amount.

* * * * *